(12) United States Patent
Asaad et al.

(10) Patent No.: US 9,230,046 B2
(45) Date of Patent: Jan. 5, 2016

(54) GENERATING CLOCK SIGNALS FOR A CYCLE ACCURATE, CYCLE REPRODUCIBLE FPGA BASED HARDWARE ACCELERATOR

(75) Inventors: Sameth W. Asaad, Briarcliff Manor, NY (US); Mohit Kapur, Sleepy Hollow, NY (US)

(73) Assignee: International Business Machines Corporation, Armonk, NY (US)

( * ) Notice: Subject to any disclaimer, the term of this patent is extended or adjusted under 35 U.S.C. 154(b) by 589 days.

(21) Appl. No.: 13/435,614

(22) Filed: Mar. 30, 2012

(65) Prior Publication Data

US 2013/0262073 A1 Oct. 3, 2013

(51) Int. Cl.
*G06F 17/50* (2006.01)
*G06F 9/455* (2006.01)

(52) U.S. Cl.
CPC ............ *G06F 17/5027* (2013.01); *G06F 9/455* (2013.01)

(58) Field of Classification Search
CPC ............ G06F 17/5022; G06F 17/5027; G06F 17/5054; G06F 1/04; G06F 1/06; G06F 1/10; G06F 17/50; G06F 9/455
See application file for complete search history.

(56) References Cited

U.S. PATENT DOCUMENTS

| | | | |
|---|---|---|---|
| 5,646,545 A | 7/1997 | Trimberger et al. | |
| 6,118,724 A | 9/2000 | Higginbottom | |
| 6,993,469 B1 | 1/2006 | Bortfeld | |
| 7,310,760 B1 * | 12/2007 | Sun et al. | 714/745 |
| 7,415,594 B2 | 8/2008 | Doerr et al. | |
| 7,587,697 B1 | 9/2009 | Schmit et al. | |
| 7,774,190 B1 * | 8/2010 | Nemecek | 703/23 |
| 7,930,162 B1 | 4/2011 | Chan et al. | |
| 8,067,948 B2 * | 11/2011 | Sequine | 324/678 |

(Continued)

FOREIGN PATENT DOCUMENTS

| | | |
|---|---|---|
| WO | WO 2006101836 A2 | 9/2006 |
| WO | WO 2008014494 A2 | 1/2008 |

OTHER PUBLICATIONS

Asaad et al., A Cycle-accurate, Cycle-reproducible multi-FPGA System for Accelerating Multi-core Processor Simulation, FPGA'12, Feb. 22-24, 2012, Monterey, California.*

(Continued)

*Primary Examiner* — Kandasamy Thangavelu
(74) *Attorney, Agent, or Firm* — Scully, Scott, Murphy & Presser, P.C.; Anne V. Dougherty, Esq.

(57) ABSTRACT

A method, system and computer program product are disclosed for generating clock signals for a cycle accurate FPGA based hardware accelerator used to simulate operations of a device-under-test (DUT). In one embodiment, the DUT includes multiple device clocks generating multiple device clock signals at multiple frequencies and at a defined frequency ratio; and the FPG hardware accelerator includes multiple accelerator clocks generating multiple accelerator clock signals to operate the FPGA hardware accelerator to simulate the operations of the DUT. In one embodiment, operations of the DUT are mapped to the FPGA hardware accelerator, and the accelerator clock signals are generated at multiple frequencies and at the defined frequency ratio of the frequencies of the multiple device clocks, to maintain cycle accuracy between the DUT and the FPGA hardware accelerator. In an embodiment, the FPGA hardware accelerator may be used to control the frequencies of the multiple device clocks.

25 Claims, 4 Drawing Sheets

(56) References Cited

U.S. PATENT DOCUMENTS

| | | | |
|---|---|---|---|
| 8,145,469 B2 | 3/2012 | Birguer | |
| 8,595,683 B1* | 11/2013 | de Buren et al. | 716/137 |
| 2002/0073375 A1 | 6/2002 | Hollander | |
| 2002/0116168 A1* | 8/2002 | Kim | 703/28 |
| 2003/0061341 A1* | 3/2003 | Loh et al. | 709/224 |
| 2004/0254779 A1* | 12/2004 | Wang et al. | 703/27 |
| 2005/0131670 A1 | 6/2005 | Wang et al. | |
| 2005/0154577 A1 | 7/2005 | Sakane et al. | |
| 2005/0276142 A1 | 12/2005 | Pelley | |
| 2006/0015313 A1* | 1/2006 | Wang et al. | 703/14 |
| 2006/0117274 A1 | 6/2006 | Tseng et al. | |
| 2008/0136470 A1 | 6/2008 | Moyal et al. | |
| 2009/0006894 A1 | 1/2009 | Bellofatto et al. | |
| 2009/0083682 A1 | 3/2009 | Akiba et al. | |
| 2009/0271167 A1 | 10/2009 | Zhu et al. | |
| 2009/0319253 A1 | 12/2009 | Phillips et al. | |
| 2010/0005232 A1 | 1/2010 | Randell et al. | |
| 2012/0117413 A1* | 5/2012 | Asaad et al. | 713/501 |
| 2012/0290993 A1* | 11/2012 | Chene | 716/106 |
| 2013/0170525 A1* | 7/2013 | Asaad et al. | 375/219 |
| 2013/0262072 A1* | 10/2013 | Asaad et al. | 703/13 |

OTHER PUBLICATIONS

Mavroidis et al., "Efficient Testbench Code Synthesis for a Hardware Emulator System", 2007.

Kumar, designideas Readers Solve Design Problems: Compute a histogram in an FPGA with one clock:, EDN, Feb. 3, 2011, pp. 43-49.

"Nios II Embedded Design Suite 6.0 Errata Sheet", Altera Corporation. ES-N2EDS6.0-1.1, Jun. 2006, pp. 1-17.

International Search Report and Written Opinion dated Jun. 14, 2013 issued in PCT/US2013/032903 filed Mar. 19, 2013.

Huang et al., "SoC HW/SW Verification and Validation", 16th Asia and South Pacific Design Automation Conference, Jan. 25-26, 2011, pp. 297-300.

Cofler, Andrew M., "A Reprogrammable EDGE Baseband and Multimedia Handset SoC With 6-Mbit Embedded DRAM", IEEE Journal of Solid-State Circuits (Jan. 2006), vol. 41, No. 1, pp. 97-106.

Micron Technology, Inc., "Various Methods of DRAM Refresh", TN-04-30, pp. 1-4.

Wang, Perry H., "Intel Atom Processor Core Made FPGA-Synthesizable", FPGA'09, Feb. 22-24, 2009, pp. 209-218.

Office Action dated Dec. 16, 2014, received in a related U.S. Appl. No. 13/435,707.

U.S. Office Action dated Jul. 1, 2015 issued in U.S. Appl. No. 13/435,707.

* cited by examiner

GENERATING CLOCK SIGNALS FOR A CYCLE ACCURATE, CYCLE REPRODUCIBLE FPGA BASED HARDWARE ACCELERATOR

STATEMENT OF GOVERNMENT INTEREST

This invention was made with Government support under Contract No.: B554331 awarded by Department of Energy (DOE). The Government has certain rights in this invention.

BACKGROUND OF THE INVENTION

The present invention generally relates to simulating the operation of integrated circuits, and more specifically, to using Field Programmable Gate Arrays to simulate the operation of integrated circuits.

As system on chip and multiple processor cores on a single chip are becoming a common practice, simulating these complex chips is becoming an expensive challenge. One of the techniques adopted in simulating these complex systems is Field Programmable Gate Array (FPGA) based hardware accelerators. These hardware accelerators work on the principle of dividing the chip design (device under test—DUT) into small blocks. These blocks are then implemented on various FPGAs. These FPGAs are inter-connected to each other in the same fashion as the original DUT design. The chip or DUT simulations can then be run on this specialized FPGA hardware instead of running them on a conventional simulator. Conventional simulators are completely written in software and run on a general purpose computer. Hardware simulators can give typically a speed advantage of several orders of magnitude over conventional simulators.

Accelerating the simulation may be desirable for a number of reasons. The number of simulations to be performed to validate a large digital chip is very large. To complete those simulations in a reasonable time using software, a large number of computers have to be employed, with the corresponding associated cost. An accelerated simulator reduces this number. Furthermore, it is often necessary to simulate a circuit for a very long time before getting to the point of interest. This long simulation is a sequential process that may take several days for a software implementation, and cannot be sped up by just using more computers.

One of several design challenges which arise in building hardware simulation accelerators is cycle accuracy. The FPGA based hardware accelerator should exactly match the behavior of the DUT on a cycle by cycle basis, which means—if the DUT were simulated on a software simulator or when the DUT is built into a single or multiple chips, at any given DUT clock cycle, all three systems—the hardware accelerator, the software simulator and the DUT chip—should be in the same state. This becomes a significant challenge in the design of hardware accelerators, as the DUT design may contain different kinds of memory—register arrays, SRAMs, embedded or external DRAMs. All of these DUT memory types have to be mapped into the FPGA on-chip memory or external memory connected to the FPGA.

Another design challenge in building hardware simulation accelerators is cycle reproducibility, which is defined as follows: multiple executions starting from the same initial condition shall yield identical trace for all DUT state. Every time that the simulation is performed with exactly the same stimulus, exactly the same results should be obtained by the simulator. In some instances, for example, the system might be running the simulation at different levels of optimization. At the highest level of optimization, the simulation runs very fast, and is used to check that nothing is wrong. If something is wrong, though, and the optimized simulation flags it, it is desirable to reproduce this simulation at a lower level of optimization that leaves a good trace for circuit debugging. The two simulations should behave exactly the same, or it would not be feasible to debug the circuit in this manner. Even though this cycle reproducibility property is usually easy to ensure in software implementations of the simulator, it becomes a significant issue when the software technique is replaced with a hardware accelerator technique. In one or more cases, this aspect is one of the more severe limitations on how much it is possible to speed-up the simulation of a digital circuit.

Cycle reproducibility is critical for enabling efficient debug of the simulation, and this requirement constrains how clocking and reset of the entire acceleration system is implemented. The requirement for cycle reproducibility also adds significant challenge in how the DUT memory is mapped onto the accelerator platform. Since the memory of the DUT constitutes a large portion of the system state, all addressable content of such memory needs to be properly initialized and maintained to match that of the software simulation and final chip implementation.

FPGA based simulation accelerators are expected to provide the same level of debug capability which a software based simulator provides, namely: single stepping, breakpoint insertion and waveform generation.

BRIEF SUMMARY

Embodiments of the invention provide a method, system and computer program product for generating clock signals for a cycle accurate FPGA based hardware accelerator used to simulate operations of a device-under-test (DUT). In one embodiment, the DUT includes multiple device clocks generating multiple device clock signals at multiple frequencies and at a defined frequency ratio; and the FPG based hardware accelerator includes multiple accelerator clocks generating multiple accelerator clock signals to operate said FPGA based hardware accelerator to simulate the operations of the DUT. In one embodiment, the method comprises mapping operations of the DUT to the FPGA based hardware accelerator, and generating the accelerator clock signals at multiple frequencies and at said defined frequency ratio of the frequencies of the multiple device clocks, to maintain cycle accuracy between the DUT and the FPGA based hardware accelerator.

In one embodiment, the accelerator clocks are free-running clocks, the device clocks are stoppable clocks, and the free-running clocks are phase locked to the stoppable clocks.

In an embodiment, the mapping operations of the DUT to the FPGA based hardware accelerator includes performing defined synchronous events and defined asynchronous events on the FPGA; and all of said defined asynchronous events performed on the FPGA occur in fixed time intervals to maintain cycle reproducibility of the FPGA based hardware accelerator.

In an embodiment, the method further comprises using the FPGA based hardware accelerator to control the frequencies of the multiple device clocks.

In one embodiment, the FPGA based hardware accelerator is used to generate the multiple device clock signals.

In an embodiment, a single clock source on the FPGA based hardware accelerator is used to generate all of the multiple device clock signals.

In one embodiment, the method further comprises stopping and then restarting the device clocks at specified times.

When the device clocks are restarted, the device clocks have start-up phases, and the start-up phases of all the device clocks are the same to provide cycle reproducibility on the DUT.

In one embodiment, the multiple frequencies of the device clocks have a least common multiple frequency. A single generator clock is used to generate a generator clock signal at said least common multiple frequency, and all of the multiple device clock signals are generated from this generator clock signal.

In an embodiment, the FPGA hardware accelerator comprises a multitude of FPGAs, and a first of the FPGAs transmits signals to a second of the FPGAs over a plurality of wires. A maximum frequency for the DUT is determined in accordance with the following:

C is equal to the number of said plurality of wires;
Cw is a defined maximum frequency of a defined cycle at which the C wires can operated to transmit said signals from the first FPGA to the second FPGA;
P is a defined maximum number of the signals that are transmitted from the first FPGA to the second FPGA;
M=P/C;
L is the number of the defined cycle required for the signals to be transmitted from the first FPGA to the second FPGA; and
the DUT is operated at a frequency less than or equal to a defined maximum device frequency Ca, where: Ca is less than or equal to Cw/(M+L).

In an embodiment, the DUT includes a DUT memory including one or more read ports and one or more write ports, and Nd is set equal to the larger of the number of the read ports or the number of write ports of the DUT memory. The DUT has a data width of Wd, and the FPGA hardware based accelerator has a data width of Wt. The FPGA hardware based accelerator includes one or more target memories, and At is a given number representing the number of the defined clock cycles consumed to perform a read or a write operation on the memory of the FPGA hardware based accelerator. The DUT clock Ca' and the target memory clock obey the following equation: Ca' is less than or equal to Cm/((Wd/Wt)(At+Nd)). The equations:

Ca' is less than or equal to Cm/((Wd/Wt)(At+Nd)); and

Ca is less than or equal to Cw/(M+L), are solved simultaneously.

In one embodiment, the FPGA hardware accelerator includes a plurality of FPGAs, and each of the FPGAs is associated with a target memory and includes a clock generator circuit to generate an FPGA clock signal. The DUT is operated in defined cycles at a defined frequency. In an embodiment, the mapping operations of the DUT to the FPGA based hardware accelerator includes using the FPGA clock signals to operate the memories associated with said plurality of FPGAs. Generating of the accelerator clock signals includes using the clock generator circuits of the plurality of FPGAs to generate the FPGA clock signals at a frequency greater than said defined frequency to operate the memories associated with said plurality of FPGAs at a frequency greater than said defined frequency.

In one embodiment, each of the plurality of FPGAs includes a plurality of output buffers for receiving the FPGA clock from the clock generators of said each FPGA and for generating output clock signals at different frequencies.

In an embodiment, each of the plurality of FPGAs further includes a clock divider for receiving the FPGA clock signal from the clock generator of said each FPGA, for generating a plurality of gating signals, and for applying a respective one of the gating signals to each of the output buffers of said each FPGA to control the frequency of the output clock signal generated by said each of the output buffers. A first of the output buffers of said each FPGA receives a first of the gating signals from the clock divider of said each FPGA, and uses said first gating signal to generate the output clock signal of said first output buffer at a first frequency. A second of the output buffers of said each FPGA receives a second of the gating signals from the clock divider of said each FPGA, and uses said second gating signal to generate the output clock signal of said second output buffer at a second frequency.

DETAILED DESCRIPTION

Figure 1:
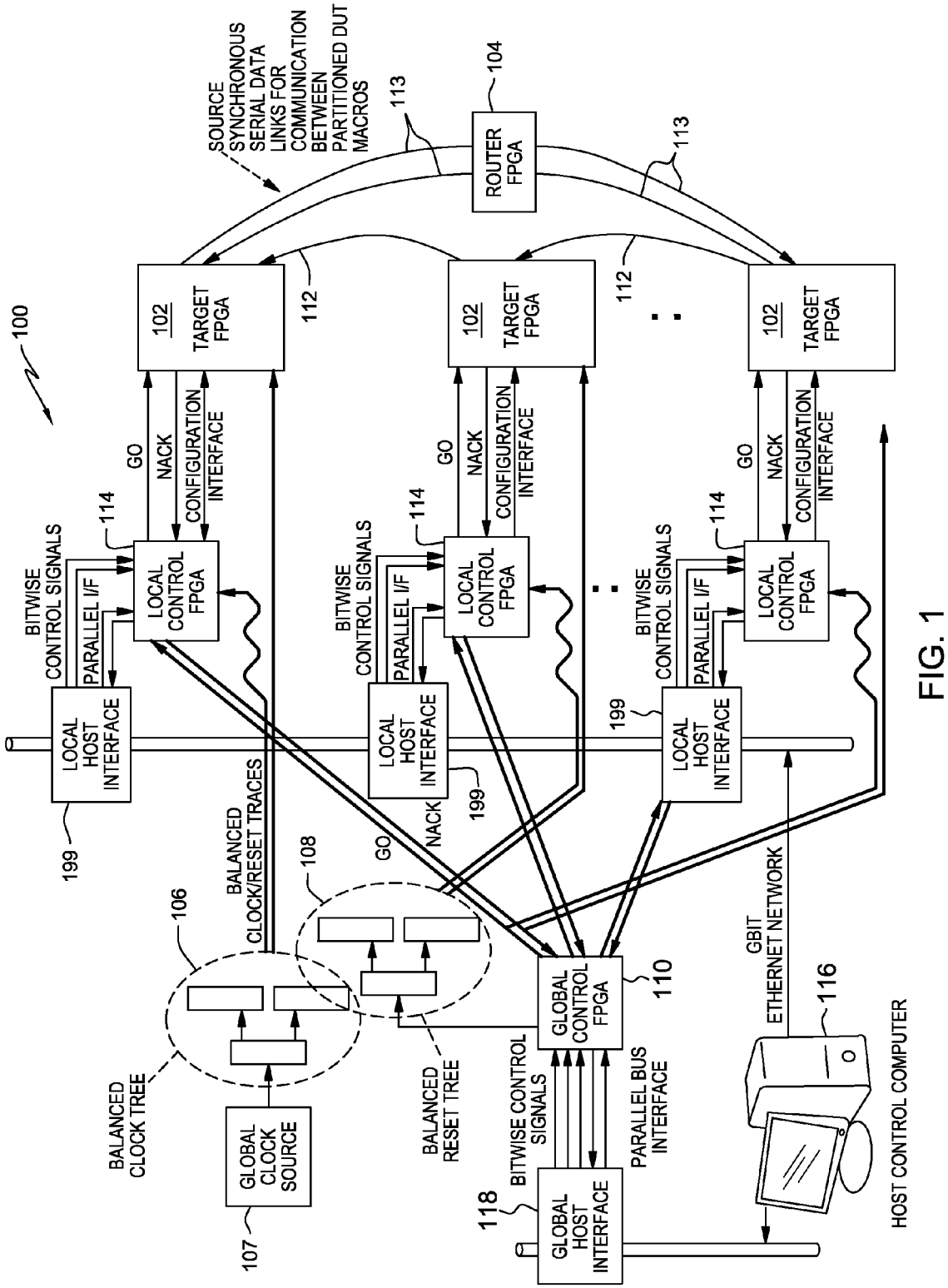
FIG. 1 shows a simulation system including a plurality of Field Programmable Gate Arrays (FPGA) devices in accordance with an embodiment of the invention.

As will be appreciated by one skilled in the art, embodiments of the present invention may be embodied as a system, method or computer program product. Accordingly, embodiments of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, embodiments of the present invention may take the form of a computer program product embodied in any tangible medium of expression having computer usable program code embodied in the medium.

Any combination of one or more computer usable or computer readable medium(s) may be utilized. The computer-usable or computer-readable medium may be, for example but not limited to, an electronic, magnetic, optical, electromagnetic, infrared, or semiconductor system, apparatus, device, or propagation medium. More specific examples (a non-exhaustive list) of the computer-readable medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CDROM), an optical storage device, a transmission media such as those supporting the Internet or an intranet, or a magnetic storage device. Note that the computer-usable or computer-readable medium could even be paper or another suitable medium, upon which the program is printed, as the program can be electronically captured, via, for instance, optical scanning of the paper or other medium, then compiled, interpreted, or otherwise processed in a suitable manner, if necessary, and then stored in a computer memory. In the context of this document, a computer-usable or computer-readable medium may be any medium that can contain, store, communicate, propagate, or transport the program for use by or in connection with the instruction execution system, apparatus, or device. The computer-usable medium may include a propagated data signal with the computer-usable program code embodied therewith, either in baseband or as part of a carrier wave. The computer usable program code may be transmitted using any appropriate medium, including but not limited to wireless, wireline, optical fiber cable, RF, etc.

Computer program code for carrying out operations of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

The present invention is described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer program instructions may also be stored in a computer-readable medium that can direct a computer or other programmable data processing apparatus to function in a particular manner, such that the instructions stored in the computer-readable medium produce an article of manufacture including instruction means which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide processes for implementing the functions/acts specified in the flowchart and/or block diagram block or blocks.

The present invention relates to the use of Field Programmable Gate Arrays (FPGAs) to simulate the operation of integrated circuits. More specifically, embodiments of the invention relate to generating clock signals or pulses for a cycle accurate, cycle reproducible FPGA based hardware accelerator when the FPGA is used to model an integrated circuit.

FPGAs are often used to simulate digital circuits. The VHDL and/or Verilog code (or other similar code) that describes the digital logic can be synthesized for an FPGA platform, and then run for a very large number of cycles to observe its behavior. Large digital circuits are typically much larger than that which can be simulated with a single FPGA, and the simulation of large digital circuits may require anywhere between 10 and 100 FPGAs. Furthermore, the simulation of a large digital circuit may require several types of operations, for example, to single step, create traces, or modify register values, or to carry out any one, some, or all of the other operations that are common in a modern simulation environment.

A simulator implemented using a large number of FPGAs typically requires that all of these FPGAs are coordinated in such a way that the different parts of the digital circuit under test are in lockstep, and remain in lockstep even when asynchronous simulation events might be occurring. A request for attention from one FPGA, for example, needs to propagate to all of the FPGAs in the simulator by the end of the current cycle, so that cycle-accurate information is preserved and can be scanned (or otherwise read) out of the simulator. This represents one manner in which assertion, print statements, and single stepping, among other features, can be implemented in the simulator.

A number of circuits and synchronization protocols may be implemented in an FPGA simulator infrastructure that allow a large number of FPGAs to synchronize on a cycle-by-cycle basis, allow for single stepping, allow any FPGA in the system to stop the simulation by the end of the current cycle, and/or guarantee cycle-reproducibility of the simulation independently of how it is being run.

The circuits used for synchronization can be classified into the following categories: high-speed clock, startup circuits, continuously running circuits, and circuits running only during simulation. Startup circuits create a global synchronous state at the beginning of the simulation. They include global reset synchronization, global clock synchronization, serial link bring-up, and the like. Continuously running circuits start running after the start-up circuits have finished initial synchronization, and keep running whether the simulation is advancing or not. These circuits include the serial links themselves, clock handshake sampling, simulation command processing, and the like. Circuits running only during simulation are active only while the simulation is active. They include all of the functional stoppable clocks, simulation counters, and the like.

With reference to FIG. 1, an exemplary system, according to an embodiment of the invention, includes a plurality of target field programmable gate arrays 102 interconnected in accordance with a connection topology and mapping portions of a target system, as well as a control module coupled to the plurality of target field programmable gate arrays. In a non-limiting example, the control module includes a host control computer 116 executing host control software, a global control field programmable gate array 110 coupled to the host control computer, and at least a first local control field programmable gate array 114 coupled to the global control field programmable gate array and at least a first portion of the plurality of target field programmable gate arrays 102.

In some cases, the system of FIG. 1 may further include a set of point-to-point free running serial communication links 112. The set of point-to-point free running serial communication links interconnect the plurality of target field programmable gate arrays 102 in accordance with the connection topology. In some embodiments, the connection topology mimics that of the target system. Some embodiments may include at least one router field programmable gate array 104 interconnecting at least a portion of the target field programmable gate arrays 102.

The global control field programmable gate array 110 is configured to initiate, stop, and single-step the simulation of the target system under control of the host control software. The at least first local control field programmable gate array 114 is configured to directly control the at least first portion of the plurality of target field programmable gate arrays and to forward system control commands from and to the global control field programmable gate array.

In some embodiments, there may be two or more local control field programmable gate arrays 114 coupled to the global control field programmable gate array 110 and each local control field programmable gate array may control one or more of the target field programmable gate arrays 102. In some embodiments, the global control field programmable gate array 110 may be further configured to receive and aggregate service request events from the local control field programmable gate arrays, and to stop simulation for service or error reporting events emanating from the plurality of target field programmable gate arrays. The local control field programmable gate arrays may also be responsible for direct control of corresponding portions (one or more) of the plurality of target field programmable gate arrays 102. In some embodiments, direct control of the corresponding portions of the plurality of target field programmable gate arrays by the local control field programmable gate arrays includes downloading target field programmable gate array configuration and memory image initialization.

Additional elements include a balanced clock distribution network 106 configured to distribute a reference clock signal 107, and a balanced reset distribution network 108 coupled to the control module and configured to distribute a reset signal to the plurality of target field programmable gate arrays. The control module and the balanced reset distribution network are cooperatively configured to initiate and control a simulation of the target system with the plurality of target field programmable gate arrays.

Figure 2:
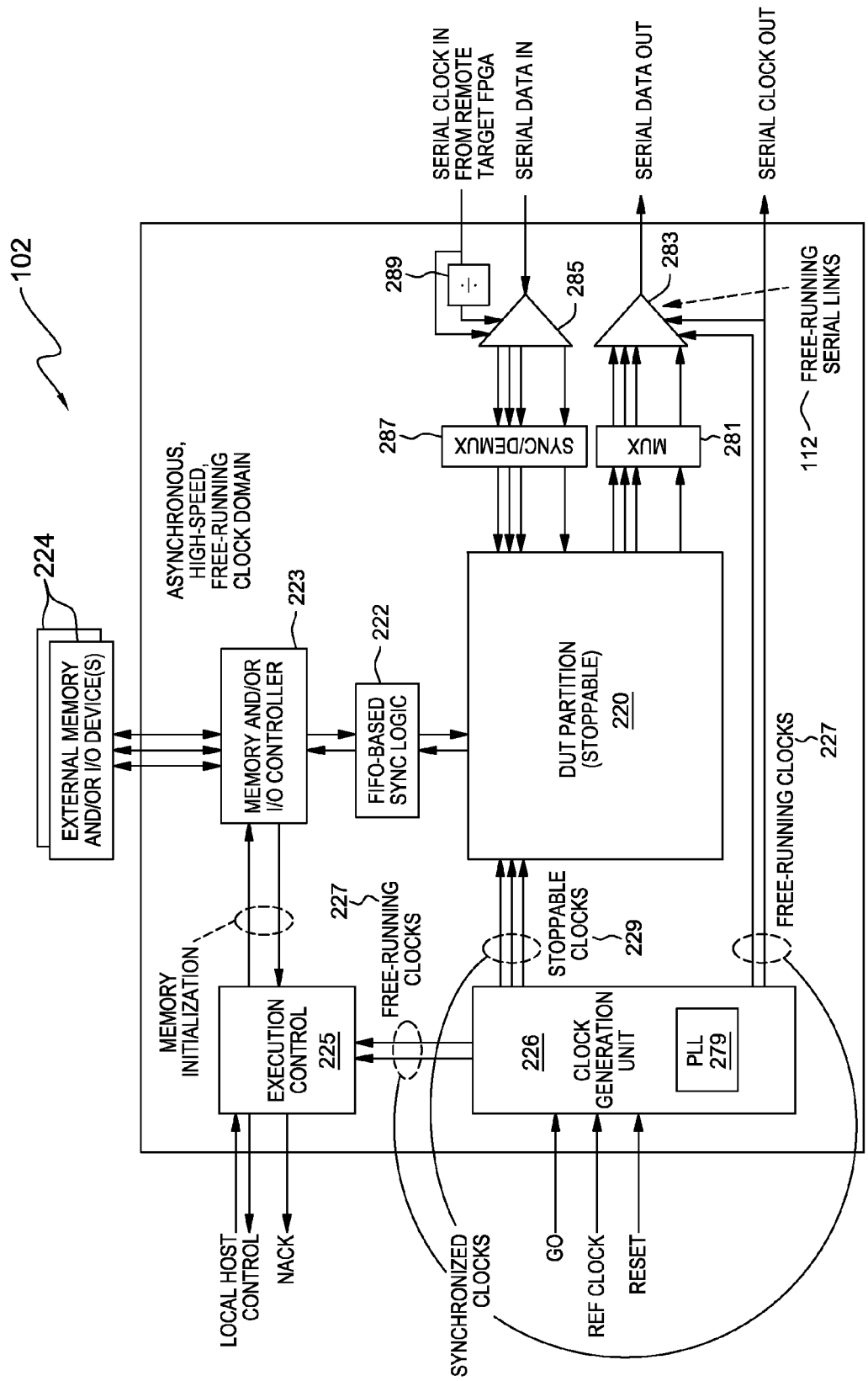
FIG. 2 depicts an exemplary architecture of a FPGA device.

With reference to FIGS. 1 and 2, a plurality of local clock control state machines 226 reside in the target field programmable gate arrays 102. The local clock control state machines are coupled to the balanced clock distribution network and obtain the reference clock signal therefrom. The plurality of local clock control state machines are configured to generate a set of synchronized free-running and stoppable clocks 227, 229 to maintain cycle-accurate and cycle-reproducible execution of the simulation of the target system.

In one or more embodiments, the balanced clock distribution network 106 distributes the reference clock signal 107 with a low skew. The balanced reset distribution network 108 distributes the reset signal with a low skew; the reset signal is, in one or more embodiments, a level-sensitive reset signal. As used herein, "low skew" is relative to the reference clock signal, such that the total skew of the balanced reset distribution network 108, from the earliest arriving to the latest arriving, is small relative to the cycle time of the reference clock signal, so that it can be guaranteed that it arrives everywhere in more or less the same reference clock cycle.

In some embodiments, the reference clock signal 107 is the highest clock frequency in the apparatus; and in other embodiments, the reference clock signal 107 is a reference to generate a highest clock frequency in the apparatus. In the latter instances, the plurality of target field programmable gate arrays 102 further include a plurality of phase-locked loops that generate the highest clock frequency from the reference. Some embodiments include at least one external memory device 224 accessible to the plurality of target field programmable gate arrays 102 and containing test code for conducting the simulation of the target system. Additional details of FPGA based hardware accelerators that may be used in embodiments of the invention are described in U.S. patent application Ser. No. 12/941,834, filed Nov. 8, 2010, for "Method And Infrastructure For Cycle-Reproducible Simulation On Large Scale Digital Circuits On A Coordinated Set Of FPGAs," the disclosure of which is hereby incorporated herein by reference in its entirety.

In an embodiment of the operation of simulation system 100, short snapshots are collected at regular intervals to identify a period where a fault originates, and then a more complete waveform trace is obtained in the identified period where the fault occurs, via a simulation replay at a finer granularity. For example, instead of taking a complete trace of the simulation, which takes a long time, a snapshot may be taken every predetermined number of cycles (e.g., several thousand), and the first snapshot where the fault occurs may be found. A complete trace may be conducted (cycle-by-cycle snapshots) between the last snapshot before the fault was observed and the first snapshot where the fault was noted.

In order to achieve this simulation, it is important to achieve both cycle accuracy and cycle reproducibility. This is a significant challenge in the design of hardware accelerators and constrain how clocking and reset of the acceleration system is implemented.

Designing a clock generation circuit and a distribution network for an FPGA based hardware accelerator is a multi dimensional problem. The DUT to be mapped onto the FPGA accelerator can itself have multiple clocks. For cycle accuracy, all the DUT clocks must have the exact same ratio with respect to each other in the mapped version of the design as they would have in the ASIC implementation. This linear scaling down is required to accommodate several features. Let C1, C2, C3, Cn be the N clocks present in the DUT. In embodiments of the invention, the FPGA accelerator uses a single clock source to generate all the DUT clock signals. In other embodiments of the invention, if the accelerator uses multiple clock sources, these clock sources come from a single reference clock. If this condition is not met, different clocks may have different startup phases. This phase ambiguity in DUT clock phases at startup will cause loss of cycle reproducibility. Hence, to obtain a single generator clock, which will generate all the DUT clocks, the generator clock should satisfy the following formula:

$$Cgc = \text{Least common multiple } (C1, C2, C3, Cn) \quad (1)$$

Where Cgc represents a hypothetical generator clock for DUT (ASIC) frequencies. To calculate the corresponding generator clock for the FPGA hardware accelerator, additional bounding conditions need to be taken into account.

In embodiments of the invention, a DUT which has asynchronous clock domains, also satisfies equation (1). Even if C1, C2, Cn are asynchronous to each other, a single clock generator frequency, Cgc may be used to generate all the clocks in the hardware accelerator. This is needed to maintain cycle reproducibility of the simulator. Lack of this property may make it difficult or impossible to consistently reproduce bugs in the DUT, when it is simulated on a hardware accelerator.

As stated earlier, the DUT may need to be partitioned across multiple FPGAs. A hardware accelerator can have hundreds of such FPGAs connected to each other. Due to pin limitations on each FPGA, embodiments of the invention multiplex signals on the transmitting FPGA and de-multiplex them on the receiving FPGA. To prevent any deviation form cycle accuracy, the multiplexor/de-multiplexor or SerDes may appear as a wire to the rest of DUT logic. In order to achieve this, the SerDes is clocked at a much higher rate compared to the DUT. The frequency difference between SerDes line rate and DUT clock rate can then be utilized to obtain wire like behavior.

Let C be the number of wires available for routing on the printed circuit board (PCB) between two FPGAs. This is usually decided by the system cost and/or the limit on the number of FPGA I/O pins and routing resources available on the printed circuit board. Let P be maximum number of functional signals that need to be routed, between the two FPGAs. Hence the worst case multiplex ratio, M, for a homogenous system is defined as:

$$M = P/C \qquad (2)$$

The term homogenous represents a multiplexor with single multiplex ratio M used everywhere in the system. Embodiments of the invention present performance enhancement techniques where heterogeneous systems are considered.

Let Cw be the maximum clock frequency at which the C wires on the PCB can be operated. Cw is limited by several factors such as the quality of printed circuit board material, transmitter/receiver design, packaging, cross-talk between wires, inter symbol interference, etc. Let L be the number of Cw cycles required for the signal to travel between the two FPGAs. Thus L represents the latency of the link and comprises of flight time between FPGAs, propagation delay in output drivers and input receivers of the two FPGAs and any additional cycles to compensate for clock phase differences between various FPGAs.

The three variables described above—M, Cw and L—will decide the maximum clock frequency at which the DUT can be operated in the accelerator. Let this be called Ca.

$$Ca <= Cw/(M+L) \qquad (3)$$

Equation (3) can also be used to form the basis for a cycle accurate behavior of these links. As long as the latency of transmission and reception is less than the period of the DUT cycle, the entire link will appear as a wire to the DUT.

In embodiments of the invention, only natural values are used for DUT clock frequency Ca, i.e. Ca belongs to the set of natural numbers. This condition transforms Equation 3 from a linear function to a staircase function.

For a system which uses a homogenous multiplex ratio M (from equation (2), the communication across multiple FPGAs has to complete within a single cycle of clock Ca (from equation 3).

Let Cd denote the maximum frequency of all the DUT clocks.

$$Cd = \text{maximum } (C1, C2, C3, Cn) \qquad (4)$$

From Equation 1, 3 and 4, one can compute the generator clock for a homogenous multiplex ratio hardware accelerator to be:

$$Cga = Cgc * Ca/Cd \qquad (5)$$

Equations 1 to 5 simplify the computation and implementation of the clocking network but have a limitation that the whole system scales based upon the worst case multiplex ratio.

To address the above limitation, the signals crossing FPGA boundaries can be grouped into multiple bins according to their clock domains, and the serdes links designed with optimal multiplexing ratios for each bin. To achieve this, equation (3) will be computed for each clock domain and simultaneously solved.

The FPGA based hardware accelerators require access to memory. The memory could be used to represent the memory of the DUT or as additional debug memory. Consider the case where a DUT memory needs to be mapped to memory present in the form of SRAM or DRAM on a FPGA hardware accelerator board. This memory is referred to as target memory.

There are several factors involved in mapping DUT memory to target memory which affect the computation of accelerator clocks. These factors include mapping of multiple read-write ports in DUT memory to a single read-write port of the target memory, handling data width mismatches between DUT and target memory, etc.

As in the case of SerDes links, target memory too needs to be hyper clocked in order to maintain cycle accuracy between DUT and target memory models. To derive the frequency relationship between a hyper clocked target memory and DUT clock frequency, let Cm denote the maximum clock frequency at which the target memory can be operated. Let the DUT memory to be mapped have Nd read or write ports, whichever is larger.

$$Nd >= 1 \qquad (6)$$

Let the target memory have a single read write port. Let the data width of the DUT memory be Wd and that of a target memory be Wt.

$$Wd >= Wt \qquad (7)$$

Let At be the worst case number of cycles consumed of the Cm clock to perform a read or a write on target memory.

To maintain cycle accuracy, the DUT clock Ca' and the target memory clock must obey the following equation:

$$Ca' <= Cm/((Wd/Wt)*(At+Nd)) \qquad (8)$$

Note Ca' from Equation 8 could be representing the same frequency as Ca from Equation 3 and therefore these equations are solved simultaneously to achieve an optimum solution. The possible solutions to Equation 8 must also lie in the set of natural numbers.

Once all the clock frequencies are computed, the next challenge is to design the clock generation and distribution mechanism. In an accelerator one could have hundreds of FPGAs inter connected to each other. This leads to two possible scenarios:

1. Centralized clock generator circuit on one FPGA, distributing all clock signals to the rest of the FPGAs in the system. This technique will result in complex multiple clock distribution networks.
2. Distributing a single reference clock, Cga, to all FPGAs in the system and locally replicating the clock generation circuit on each FPGA.

Embodiments of the invention use the second approach because it requires the distribution of a single clock in the system.

Most FPGAs available in the market today provide phase locked loops (PLLs) to generate clocks. If the PLL is used to generate all the clock signals, distributing those signals with FPGA and performing a multi-frequency timing analysis is still a complex problem. Embodiments of the invention use proposes a two part solution:

1. Use the PLL of each FPGA to reduce jitter in the generator clock signal Cga and to generate all the hyper clocks required to run the multiplexor/de-multiplexor as well as memory of the FPGA.
2. The clean version of the Cga generated by the PLL can then be used to generate all the DUT clocks using phase-hold scheme, where the phase-hold scheme refers to gating off the pulses from the generator clock to obtain a lower frequency DUT clock.

Figure 3:
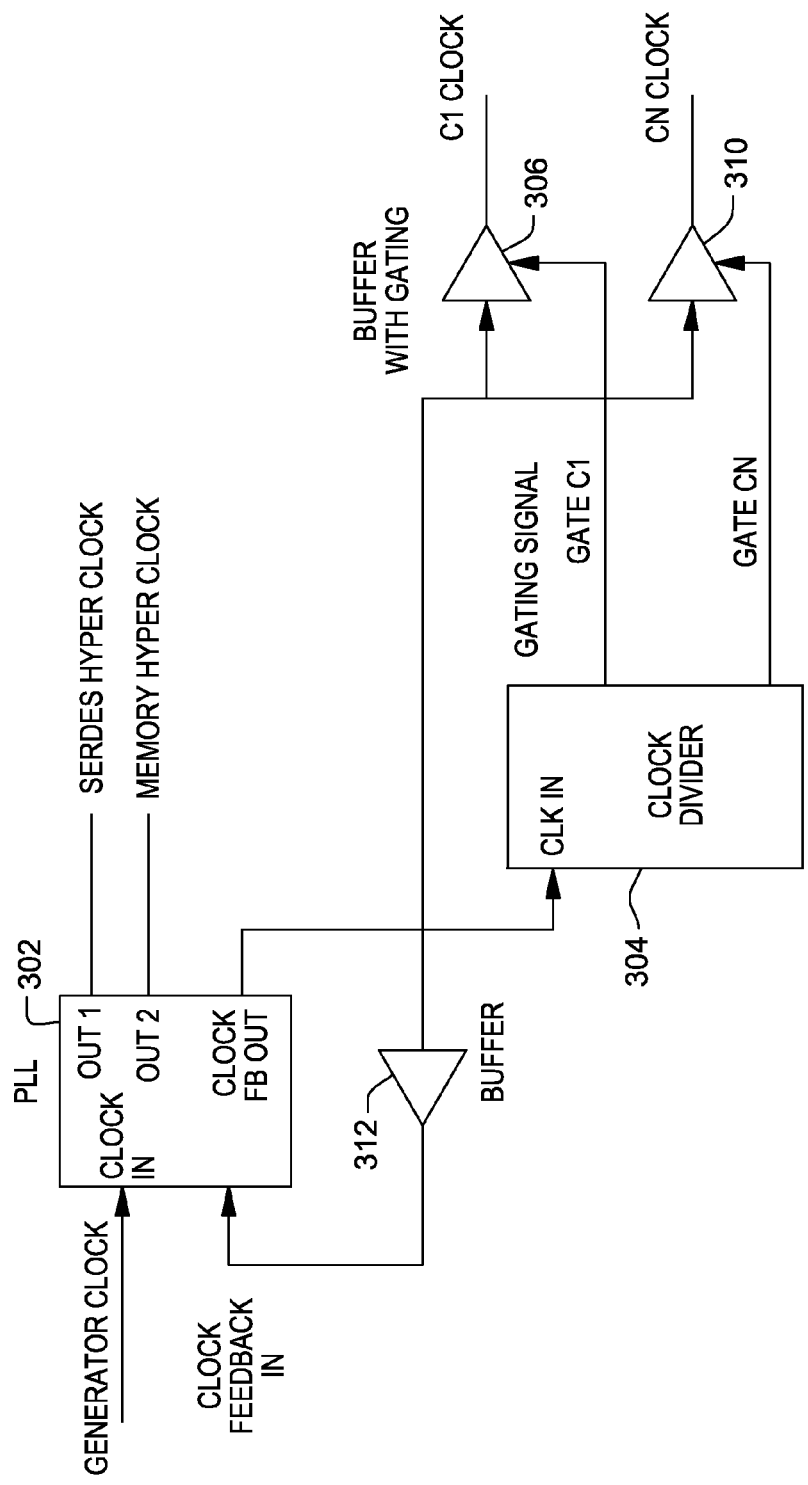
FIG. 3 illustrates a clock generation subsystem within an FPGA in accordance with an embodiment of the invention.

FIG. 3 illustrates the clock generation within an FPGA. Use of the phase-hold scheme solves multiple problems.

First, it makes the timing analysis easier and faster. Second, the gating signal for holding the clock phase can also be combined with a signal which will enable starting and stopping of DUT clocks.

As illustrated in Equation (1) and Equation (5), the generator clock frequencies are least common multiples of DUT clock frequencies. Therefore the gating signal required for phase-hold can be obtained by simply dividing the generator clock.

FIG. 3, more specifically, shows the PLL 302, clock divider 304 and output buffers 306, 310. The PLL receives two inputs, the reference clock signal Cga and a feedback signal. The PLL outputs three clock signals. Two of these output signals are applied to the SerDes and the memory, and the third output signal is applied to the clock divider 304.

The clock divider receives the output from the PLL 302 and generates the desired gating signals C1, C2, . . . , CN. Each output buffer 306, 310 receives the clock signal from PLL 302 and an associated gating signal from the clock divider. Each output buffer 306, 310 outputs a clock signal, and the timing of this output signal is determined by the gating signal applied to the output buffer from the clock divider 304. One of the PLL outputs is also fed back to the PLL, via buffer 312, to control the timing of the PLL outputs.

Figure 4:
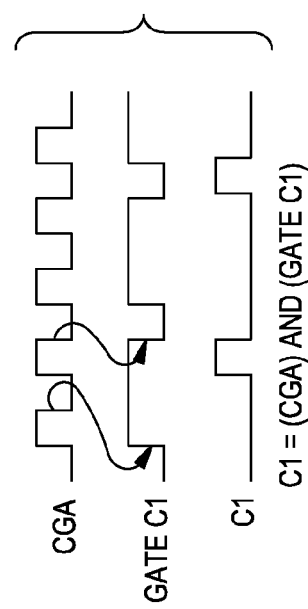
FIG. 4 shows various clock pulses generated in the subsystem of FIG. 3.

FIG. 4 illustrates the timing of signals Cga, Gate C1 and C1. Gate C1 has a frequency of one-half the frequency of Cga. Each pulse of the gate C1 is used to output one clock signal from buffer C1, so that the frequency of the buffer C1 is the same as the frequency of the gate C1 signal.

All the PLLs in different FPGAs may lock at different times. Also, the locking time of a single PLL in one FPGA over multiple power cycles cannot be predicted. These two timing uncertainties cause the loss of cycle reproducibility of the hardware accelerator. In order to maintain cycle reproducibility, embodiments of the invention separate timing events:
1. After a power cycle, wait until all PLLs attain a lock.
2. Issue a system wide reset, which is distributed through a low skew network. This reset signal will mark the end of the PLL lock phase and the beginning of link training as well as memory training phase.
3. Wait for a fixed amount of time and read the status of links and memory.
4. Issue a system wide start of DUT operations command.

Additional details that may be used in embodiments of the invention to maintain cycle accuracy and cycle reproducible are described in copending application no. 13/435,707, filed herewith, for "Cycle Accurate And Cycle Reproducible Memory For An FPGA Based Hardware Accelerator," the disclosure of which is hereby incorporated herein by reference in its entirety.

Thus, the problem of uncertainty of completion of certain events is solved by bounding these event into fixed time intervals. Further, the property of cycle reproducibility is moved to operations related to DUT. All the infrastructure events like link training, memory interface training are handled in separate fixed time intervals that are completed before the first DUT clock cycle is issued.

Figure 5:
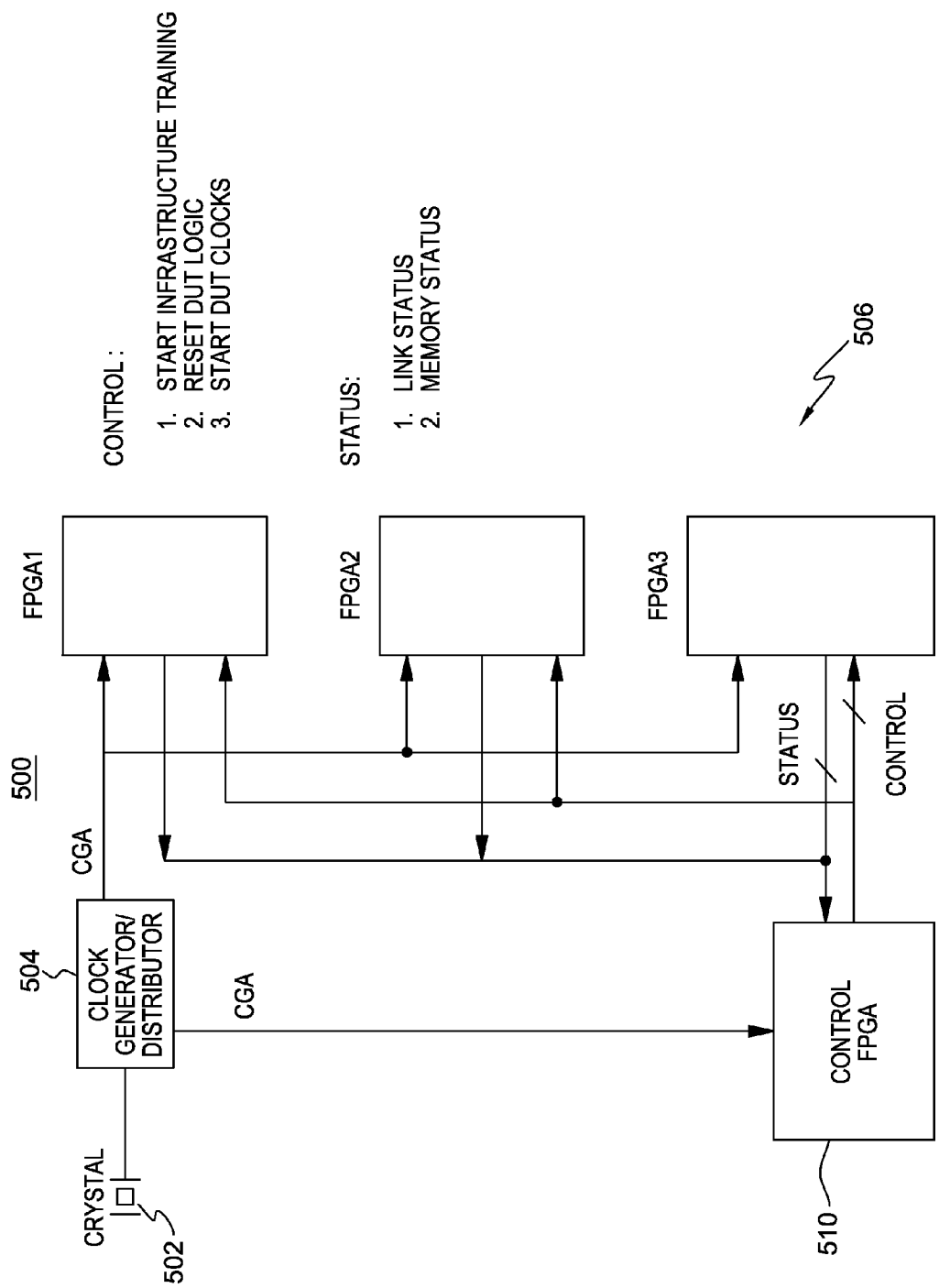
FIG. 5 shows one embodiment of a hardware accelerator in accordance with this invention.

FIG. 5 shows the block diagram of the hardware accelerator 500 in accordance with an embodiment of the invention. This accelerator comprises a crystal 502 to supply the generator clock, a clock distribution chip 504 which feeds the generator clock through balanced clock trees to multiple FPGAs 506. The accelerator 500 also includes a control FPGA 510 which will create the discrete timing events described above.

Use of clock divider to generate the DUT clocks (C1, C2, C3, Cn) from the generator clock (Cga) has another advantage—the state of the divider is always known. In embodiments of the invention this state information is used to start and stop the DUT clocks. To support features like breakpoint insertion and single stepping, the clocks are stopped at any given DUT cycle and restarted after an arbitrarily elapsed time at the same state of the DUT as when the clocks were stopped. To achieve this, this embodiments of the invention use a DUT cycle counter. This counter can be clocked using the highest frequency clock in the DUT. This counter will operate only when the DUT clocks are running. This counter will be present in the control FPGA as well as every FPGA of the system.

To implement a breakpoint insertion feature, like the one present in conventional software simulators, the breakpoint value in the control FPGA is set and a start signal is sent to all FPGAs. The control FPGA can then monitor the progress of the counter value until it reaches the breakpoint. Once the counter value reaches the breakpoint, the control FPGA will send a signal to stop the DUT clocks. The control FPGA will also record the state of the clock divider.

This clock divider, in embodiments of the invention, should always be free running to ensure a fixed phase relationship between the free running hyper clocks and the stoppable DUT clocks. The hyper clocks should be free running to avoid the link and memory interface retraining everytime the DUT clocks are stopped. After reaching the breakpoint, the user can restart the clocks, when desired. The control FPGA will wait until the clock divider reaches the same state as when the DUT clocks were stopped, and once that state is reached, the DUT clocks will be restarted. This enables features like single stepping and breakpoint insertion without losing cycle accuracy or cycle reproducibility. During the time DUT clocks are stopped, the entire state of the DUT can be extracted for further debug.

The description of the present invention has been presented for purposes of illustration and description, but is not intended to be exhaustive or to limit the invention in the form disclosed. Many modifications and variations will be apparent to those of ordinary skill in the art without departing from the scope of the invention. The embodiments were chosen and described in order to best explain the principles of the invention and the practical application, and to enable others of ordinary skill in the art to understand the invention for various embodiments with various modifications as are suited to the particular use contemplated.

The invention claimed is:

1. A method of generating clock signals for a cycle accurate FPGA based hardware accelerator used to simulate defined operations of a device-under-test (DUT), the DUT including multiple device clocks generating multiple device clock signals for operating the DUT at multiple device frequencies, said multiple device frequencies having a defined frequency ratio, the method comprising:
  mapping the defined operations of the DUT to the FPGA based hardware accelerator, the FPGA based hardware accelerator including multiple accelerator clocks generating multiple accelerator clock signals to operate said FPGA based hardware accelerator to simulate the defined operations of the DUT; and
  generating the accelerator clock signals of the FPGA based hardware accelerator at multiple accelerator frequencies, said multiple accelerator frequencies having said defined frequency ratio of the frequencies of the multiple device clocks, to maintain cycle accuracy between the DUT and the FPGA based hardware accelerator.

13

2. The method according to claim 1, wherein:
the accelerator clocks are free-running clocks;
the device clocks are stoppable clocks; and
the free-running clocks are phase locked to the stoppable clocks.

3. The method according to claim 1, wherein:
the mapping the defined operations of the DUT to the FPGA based hardware accelerator includes performing defined synchronous events and defined asynchronous events on the FPGA; and
all of said defined asynchronous events performed on the FPGA occur in fixed time intervals to maintain cycle reproducibility of the FPGA based hardware accelerator.

4. The method according to claim 1, further comprising:
using a single clock source on the FPGA based hardware accelerator to generate all of the multiple device clock signals; and
using the FPGA based hardware accelerator to control the frequencies of the multiple device clock signals.

5. The method according to claim 1, further comprising:
stopping and restarting the device clocks at specified times; and wherein:
when the device clocks are restarted, the device clocks have start-up phases;
the start-up phases of all the device clocks are the same to provide cycle reproducibility on the DUT;
the multiple frequencies of the device clocks have a least common multiple frequency; and
the method further comprises:
using a single generator clock to generate a generator clock signal at said least common multiple frequency; and
generating all of the multiple device clock signals from the generator clock signal.

6. The method according to claim 1, wherein:
the FPGA hardware accelerator comprises a plurality of FPGAs;
a first of the FPGAs transmits functional signals to a second of the FPGAs over a plurality of wires;
C is equal to the number of said plurality of wires;
Cw is a defined maximum frequency of a defined clock cycle at which the C wires can operate to transmit said functional signals from the first FPGA to the second FPGA;
P is a defined maximum number of the functional signals that are transmitted from the first FPGA to the second FPGA;
M is defined multiplex ratio, and M=P/C;
L is the number of the defined clock cycle required for the functional signals to be transmitted from the first FPGA to the second FPGA; and
the method further comprises operating the DUT at a frequency less than or equal to a defined maximum device frequency Ca, where: Ca is less than or equal to Cw/(M+L).

7. The method according to claim 6, wherein:
the DUT includes a DUT memory including one or more read ports and one or more write ports;
Nd is set equal to the larger of the number of the read ports or the number of the write ports of the DUT memory;
the DUT has a data width of Wd, and the FPGA hardware based accelerator has a data width of Wt;
the FPGA based hardware accelerator includes one or more target memories;
At is a given number representing the number of the defined clock cycles consumed to perform a read or a write operation on the one or more target memories of the FPGA based hardware accelerator;
a DUT clock frequency Ca' and a target memory clock frequency Cm obey the following equation:
Ca' is less than or equal to Cm/((Wd/Wt)(At+Nd)); and
the method further comprises simultaneously solving the equations Ca' is less than or equal to Cm/((Wd/Wt)(At+Nd)), and Ca is less than or equal to Cw/(M+L).

8. The method according to claim 1, wherein:
the FPGA hardware accelerator includes a plurality of FPGAs;
each of the FPGAs is associated with a target memory and includes a clock generator circuit to generate an FPGA clock signal;
the method further comprises operating the DUT in defined cycles at a defined frequency;
the mapping the defined operations of the DUT to the FPGA based hardware accelerator includes using the FPGA clock signals to operate the memories associated with said plurality of FPGAs; and
the generating of the accelerator clock signals includes using the clock generator circuits of the plurality of FPGAs to generate the FPGA clock signals at a clock frequency greater than said defined frequency to operate the memories associated with said plurality of FPGAs at a memory operating frequency greater than said defined frequency.

9. The method according to claim 8, wherein each of the plurality of FPGAs includes a plurality of output buffers for receiving the FPGA clock signals from the clock generators of said each FPGA and for generating output clock signals at different frequencies.

10. The method according to claim 9, wherein:
each of the plurality of FPGAs further includes a clock divider for receiving the FPGA clock signal from the clock generator of said each FPGA, for generating a plurality of gating signals, and for applying a respective one of the gating signals to each of the output buffers of said each FPGA to control the frequency of the output clock signal generated by said each of the output buffers;
a first of the output buffers of said each FPGA receives a first of the gating signals from the clock divider of said each FPGA, and uses said first gating signal to generate the output clock signal of said first output buffer at a first frequency; and
a second of the output buffers of said each FPGA receives a second of the gating signals from the clock divider of said each FPGA, and uses said second gating signal to generate the output clock signal of said second output buffer at a second frequency.

11. A clocking system for generating clock signals for a cycle accurate FPGA based hardware accelerator used to simulate defined operations of a device-under-test (DUT), the DUT including multiple device clocks generating multiple device clock signals for operating the DUT at multiple device frequencies, said multiple device frequencies having a defined frequency ratio, and wherein the defined operations of the DUT are mapped to the FPGA based hardware accelerator, the clocking system comprising:
multiple accelerator clocks for generating multiple accelerator clock signals to operate said FPGA based hardware accelerator to simulate the defined operations of the DUT; and
one or more clock controllers for operating the accelerator clocks to generate the accelerator clock signals of the FPGA based hardware accelerator at multiple accelerator frequencies, said multiple accelerator frequencies having said defined frequency ratio of the frequencies of the multiple device clocks, to maintain cycle accuracy between the DUT and the FPGA based hardware accelerator.

12. The system according to claim 11, wherein:
the accelerator clocks are free-running clocks;
the device clocks are stoppable clocks; and
the free-running clocks are phase locked to the stoppable clocks.

13. The system according to claim 11, wherein:
defined synchronous events and defined asynchronous events are performed on the FPGA; and
all of said defined asynchronous events performed on the FPGA occur in fixed time intervals to maintain cycle reproducibility of the FPGA based hardware accelerator.

14. The clocking system according to claim 11, wherein the multiple accelerator clocks and the clock controllers are on the FPGA based hardware accelerator.

15. The clocking system according to claim 11, wherein:
the FPGA hardware accelerator includes a plurality of FPGAs;
each of the FPGAs is associated with a target memory and includes a clock generator circuit to generate an FPGA clock signal;
the DUT is operated in defined cycles at a defined frequency;
the accelerator clocks operate the memories associated with said plurality of FPGAs;
the one or more clock controllers use the clock generator circuits of the plurality of FPGAs to generate the FPGA clock signals at a clock frequency greater than said defined frequency to operate the memories associated with said plurality of FPGAs at a memory operating frequency greater than said defined frequency; and
each of the plurality of FPGAs includes a plurality of output buffers for receiving the FPGA clock signal from the clock generators of said each FPGA and for generating output clock signals at different frequencies.

16. An article of manufacture comprising:
at least one non-transitory computer readable medium having computer readable program code logic tangibly embodied therein to generate clock signals for a cycle accurate FPGA based hardware accelerator used to simulate defined operations of a device-under-test (DUT), the DUT including multiple device clocks generating multiple device clock signals for operating the DUT at multiple device frequencies, said multiple device frequencies having a defined frequency ratio, the computer readable program code logic, when executing, performing the following:
mapping the defined operations of the DUT to the FPGA based hardware accelerator, the FPGA based hardware accelerator including multiple accelerator clocks generating multiple accelerator clock signals to operate said FPGA based hardware accelerator to simulate the defined operations of the DUT; and
generating the accelerator clock signals of the FPGA based hardware accelerator at multiple accelerator frequencies, said multiple accelerator frequencies having said defined frequency ratio of the frequencies of the multiple device clocks, to maintain cycle accuracy between the DUT and the FPGA based hardware accelerator.

17. The article of manufacture according to claim 16, wherein:
the accelerator clocks are free-running clocks;
the device clocks are stoppable clocks;
the free-running clocks are phase locked to the stoppable clocks;
the mapping the defined operations of the DUT to the FPGA based hardware accelerator includes performing defined synchronous events and defined asynchronous events on the FPGA; and
all of said defined asynchronous events performed on the FPGA occur in fixed time intervals to maintain cycle reproducibility of the FPGA based hardware accelerator.

18. The article of manufacture according to claim 16, wherein the computer readable program code logic, when executing, further performs:
restarting the device clocks at specified times; and wherein:
when the device clocks are restarted, the device clocks have start-up phases; and
the start-up phases of all the device clocks are the same to provide cycle reproducibility on the DUT.

19. The article of manufacture according to claim 16, wherein:
the FPGA hardware accelerator comprises a plurality of FPGAs;
a first of the FPGAs transmits functional signals to a second of the FPGAs over a plurality of wires;
C is equal to the number of said plurality of wires;
Cw is a defined maximum transmit frequency of a defined signal transmit cycle at which the C wires can operate to transmit said functional signals from the first FPGA to the second FPGA;
P is a defined maximum number of the functional signals that are transmitted from the first FPGA to the second FPGA;
M is defined multiplex ratio, and M=P/C;
L is the number of the defined cycle required for the functional signals to be transmitted from the first FPGA to the second FPGA; and
the computer readable program code logic, when executing, further performs:
operating the DUT at a frequency less than or equal to a defined maximum device frequency Ca, where: Ca is less than or equal to Cw/(M+L); and wherein:
each of the FPGAs is associated with a target memory and includes a clock generator circuit to generate an FPGA clock signal;
the DUT is operated in defined DUT cycles at a defined DUT frequency;
the mapping the defined operations of the DUT to the FPGA based hardware accelerator includes using the FPGA clock signals to operate the memories associated with said plurality of FPGAs; and
the generating of the accelerator clock signals includes using the clock generator circuits of the plurality of FPGAs to generate the FPGA clock signals at a clock frequency greater than said defined DUT frequency to operate the memories associated with said plurality of FPGAs at a memory operating frequency greater than said defined DUT frequency.

20. A method of using a Field Programmable Gate Array (FPGA) based hardware accelerator to simulate defined operations of a device-under-test (DUT), the DUT including multiple device clocks generating multiple device clock signals for operating the DUT at multiple device frequencies, said multiple device frequencies having a defined frequency ratio, the method comprising:
mapping the defined operations of the DUT to the FPGA based hardware accelerator, the FPGA based hardware accelerator including multiple accelerator clocks generating multiple accelerator clock signals to operate said FPGA based hardware accelerator to simulate the defined operations of the DUT;

generating the accelerator clock signals of the FPGA based hardware accelerator at multiple accelerator frequencies, said multiple accelerator frequencies having said defined frequency ratio of the frequencies of the multiple device clocks, to maintain cycle accuracy between the DUT and the FPGA based hardware accelerator; and using the FPGA based hardware accelerator to control the frequencies of the multiple device clocks.

21. The method according to claim 20, wherein:
the accelerator clocks are free-running clocks;
the device clocks are stoppable clocks; and
the free-running clocks are phase locked to the stoppable clocks.

22. The method according to claim 20, wherein:
the mapping the defined operations of the DUT to the FPGA based hardware accelerator includes performing defined synchronous events and defined asynchronous events on the FPGA; and
all of said defined asynchronous events performed on the FPGA occur in fixed time intervals to maintain cycle reproducibility of the FPGA based hardware accelerator.

23. A cycle accurate FPGA based hardware accelerator to simulate defined operations of a device-under-test (DUT), the DUT including multiple device clocks generating multiple device clock signals for operating the DUT at multiple device clock frequencies, said multiple device frequencies having a defined frequency ratio, the FPGA based hardware accelerator comprising:
a plurality of FPGAs, each of the FPGAs being associated with a target memory;
multiple accelerator clocks on said FPGAs for generating multiple accelerator clock signals to operate said plurality of FPGAs to simulate the defined operations of the DUT; and
one or more clock controllers for operating the accelerator clocks to generate the accelerator clock signals of the FPGA based hardware accelerator at multiple accelerator clock frequencies, said multiple accelerator frequencies having said defined frequency ratio of the frequencies of the multiple device clocks, to maintain cycle accuracy between the DUT and the FPGA based hardware accelerator.

24. The system according to claim 23, wherein:
the accelerator clocks are free-running clocks;
the device clocks are stoppable clocks;
the free-running clocks are phase locked to the stoppable clocks;
defined synchronous events and defined asynchronous events are performed on the FPGA; and
all of said defined asynchronous events performed on the FPGA occur in fixed time intervals to maintain cycle reproducibility of the FPGA based hardware accelerator.

25. The FPGA based hardware accelerator according to claim 23, wherein:
the device clocks are stopped and restarted at specified times;
when the device clocks are restarted, the device clocks have start-up phases; and
the start-up phases of all the device clocks are the same to provide cycle reproducibility on the DUT;
the multiple frequencies of the device clocks have a least common multiple frequency; and
the method further comprises:
using a single generator clock to generate a generator clock signal at said least common multiple frequency; and
generating all of the multiple device clock signals from the generator clock signal.

* * * * *